(12) United States Patent
Uchiyama et al.

(10) Patent No.: US 6,713,799 B2
(45) Date of Patent: Mar. 30, 2004

(54) ELECTRODES FOR FERROELECTRIC COMPONENTS

(75) Inventors: Kiyoshi Uchiyama, Colorado Springs, CO (US); Keisuke Tanaka, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/133,516

(22) Filed: Apr. 26, 2002

(65) Prior Publication Data

US 2003/0201475 A1 Oct. 30, 2003

(51) Int. Cl.$^7$ .................. H01L 27/08; H01L 29/94; H01L 31/119
(52) U.S. Cl. .................................. 257/295; 257/306
(58) Field of Search .......................... 257/295–310; 438/240–254

(56) References Cited

U.S. PATENT DOCUMENTS

| 5,046,043 A | 9/1991 | Miller et al. |
| 5,434,102 A | 7/1995 | Watanabe et al. |
| 5,468,684 A | 11/1995 | Yoshimori et al. |
| 5,519,234 A | 5/1996 | Araujo et al. |
| 5,566,045 A * | 10/1996 | Summerfelt et al. ........ 438/253 |
| 6,218,233 B1 * | 4/2001 | Takemura ................ 438/240 |
| 6,358,857 B1 * | 3/2002 | New ...................... 438/240 |
| 6,392,265 B2 * | 5/2002 | Kondo et al. ............. 257/295 |
| 6,396,092 B1 * | 5/2002 | Takatani et al. .......... 257/295 |

OTHER PUBLICATIONS

Jona, Franco and Shirane, G., Ferroelectric Crystals, Chapter IV and V, pp. 109–261, Dover Publications Inc., New York, 1993.

* cited by examiner

Primary Examiner—Cuong Quang Nguyen
(74) Attorney, Agent, or Firm—Patton Boggs LLP

(57) ABSTRACT

A ferroelectric integrated circuit including a substrate supporting a thin film ferroelectric material and an electrode layer in contact with the ferroelectric material, the ferroelectric material comprising a compound including a metal element, the electrode comprising the metal element. The metal element of the ferroelectric material may exist in the electrode in the pure metal form, as an alloy, as part of a crystalline compound, or as part of an amorphous material. The electrodes may be formed by a single layer, or as multi-layer structures, providing the layer adjacent the ferroelectric contains at least one of the metal elements of the ferroelectric. The electrode is formed at the eutectic temperature of its constants.

13 Claims, 5 Drawing Sheets

ELECTRODES FOR FERROELECTRIC COMPONENTS

BACKGROUND OF THE INVENTION

1. Field of the Invention

The present invention pertains to the field of thin films for use in ferroelectric integrated circuits, and, more particularly, electrodes for use in such ferroelectric integrated circuits.

2. Statement of the Problem

Ferroelectric compounds possess favorable characteristics for use in nonvolatile integrated circuit memories. See U.S. Pat. No. 5,046,043 issued Sep. 3, 1991 to Miller et al. A ferroelectric device, such as a capacitor, is useful in a nonvolatile memory when it possesses desired electronic characteristics, such as high residual polarization, good coercive field, high fatigue resistance, and low leakage current. Layered superlattice materials have been used in integrated circuits. U.S. Pat. No. 5,519,234 issued May 21, 1996, to Araujo et al., U.S. Pat. No. 5,434,102, issued Jul. 18, 1995, to Watanabe et. al., and U.S. Pat. No. 5,468,684, issued Nov. 21, 1995, to Yoshimori et al., describe these materials and processes for integrating these materials into practical integrated circuits. Perovskites, sometimes referred to as $ABO_3$-type materials, such as PZT and PLZT compounds, have also been used in integrated circuits. See Franco Jona and G. Shirane, *Ferroelectric Crystals*, Chapter IV and V, pp. 109–261, Dover Publications Inc, New York, 1993, for a general discussion of $ABO_3$-type materials.

Ferroelectric devices containing thin film ferroelectric materials are currently being manufactured. Some ferroelectric materials comprise bismuth among other elements. The desirable characteristics of a ferroelectric device, including high residual polarization, good coercive field, high fatigue resistance, and low leakage current, can be limited during manufacturing of the ferroelectric devices, due to the process temperatures conducted on the ferroelectric device during manufacturing. Annealing and baking temperatures can degrade the thin film ferroelectric material by diffusing chemical elements, necessary for good ferroelectric quality, from the thin film ferroelectric material to the electrodes.

As an example, when strontium bismuth titanate (SBT) is used in the thin film ferroelectric material, manufacturing temperatures can cause the bismuth to diffuse from the ferroelectric material to the adjacent electrodes. This causes a lower concentration of bismuth to exist in the ferroelectric material near the ferroelectric/electrode interface. It is critical to inhibit the diffusion of bismuth from the ferroelectric material to the electrodes because alteration of the amount of bismuth will change the ferroelectric properties. See U.S. Pat. No. 5,434,102 referenced above. Likewise, alteration of the amount of bismuth can create defects which alter how the ferroelectric responds to electrical fields. Similarly, diffusion or modification of other elements in the ferroelectric materials must be avoided if the ferroelectric materials and devices are to retain the properties specified.

Another problem is the relatively high manufacturing temperatures used in ferroelectric integrated circuits. The minimum feasible manufacturing process temperatures of ferroelectric materials used in the prior art is about 700° C., which is the temperature at which deposited ferroelectric materials are annealed to achieve good crystallization. It is important that any improvement in the electrode composition be able to withstand these annealing temperatures.

For the above reasons, therefore, it would be useful to have ferroelectric devices and methods for fabricating ferroelectric devices in ferroelectric integrated circuits in which the diffusion of chemical elements from the ferroelectric material to the electrodes is inhibited. Further, any such electrodes should be capable of withstanding conventional annealing times and temperatures without becoming liquid.

SUMMARY OF THE INVENTION

A solution to the problem is to provide an electrode adjacent the thin film ferroelectric material with a chemical composition that comprises at least one of the metallic chemical elements of the ferroelectric material. This chemical composition of the electrode reduces the diffusion of chemical elements from the thin film ferroelectric material to the electrodes. By decreasing the diffusion of metal elements from the thin film ferroelectric material, the ferroelectric device electrical properties, such as the polarizability, are preserved over long periods, and the reliability of the integrated circuits is greatly improved.

The metal element of the ferroelectric material may exist in the electrode in the pure metal form, as an alloy, as part of a crystalline compound, or as part of an amorphous material. The electrodes may be formed by a single layer, or as multilayer structures, providing the layer adjacent the ferroelectric contains at least one of the metal elements of the ferroelectric.

The invention provides a ferroelectric integrated circuit including a substrate supporting a thin film ferroelectric material and an electrode layer in contact with the ferroelectric material, the ferroelectric material comprising a compound including a metal element, the electrode comprising the metal element. Preferably, the electrode consists essentially of the metal element. Preferably, the metal element is titanium. Preferably, the ferroelectric material comprises bismuth titanium oxide, bismuth titanate, or bismuth lanthanum titanate. Preferably, the electrode comprises a multi-layer structure including a first layer comprising the titanium and a second layer comprising platinum.

In another embodiment, the electrode comprises a metal alloy containing the metal element. Preferably, the alloy is a platinum bismuth alloy. Preferably, the bismuth concentration is 50% or less. Most preferably, the platinum concentration in the alloy is 60% or greater. Preferably, the metal alloy is eutectic. Preferably, the ferroelectric material comprises a layered superlattice material containing bismuth. Preferably, the ferroelectric material comprises either strontium bismuth tantalate or strontium bismuth tantalum niobate. Preferably, the alloy is a platinum titanium alloy. Preferably, the ferroelectric material comprises bismuth titanate, bismuth titanium oxide, or bismuth lanthanum titanate.

In a preferred embodiment, the thin film ferroelectric material comprises a superlattice generator metal and the metal element comprises the superlattice generator metal. Preferably, the superlattice generator metal is bismuth.

Preferably, the ferroelectric material comprises strontium bismuth tantalate or strontium bismuth tantalum niobate.

In still another embodiment, the electrode comprises a crystalline compound containing the metal element. Preferably, the crystalline compound comprises an oxide. Preferably, the oxide comprises a metal oxide.

In another embodiment, the electrode comprises an amorphous material containing the metal element. Preferably, the amorphous material is an amorphous oxide. Preferably, the amorphous oxide comprises an oxide of a metal selected from the group consisting of bismuth, titanium, and tantalum.

In a preferred embodiment, there are two of the electrodes and each of the electrodes comprises the metal element. Preferably, one of the electrodes comprises a multi-layered electrode, each of the layers comprising a different material, wherein one of the layers comprises the metal element. Preferably, both of the layers comprise the metal element. Preferably, both of the electrodes comprise a multi-layered electrode.

The invention also provides a method of making a ferroelectric integrated circuit, the method comprising the steps of: applying a first electrode layer comprising at least one of the chemical elements of a thin film ferroelectric material layer to a substrate; and forming the thin film ferroelectric material layer adjacent to the first electrode layer. Preferably, the method includes applying a second electrode layer comprising at least one of the chemical elements of the thin film ferroelectric material layer adjacent the thin film layered superlattice material layer. Preferably, one of the acts of applying or the step of forming comprises annealing.

The present invention also provides a fabrication method of the ferroelectric device electrodes that can withstand the conditions of conventional annealing processes while decreasing or inhibiting the diffusion of chemical elements from the ferroelectric material layer to the electrode layer of the integrated circuit. In addition, the method is compatible with conventional ferroelectric integrated circuit processes, and in most embodiments does not increase the number of processing steps; thus, it is economical to incorporate into the fabrication process. Numerous other features, objects and advantages of the invention will become apparent from the following description when read in conjunction with the accompanying drawings.

DETAILED DESCRIPTION OF THE PREFERRED EMBODIMENT

Figure 1:
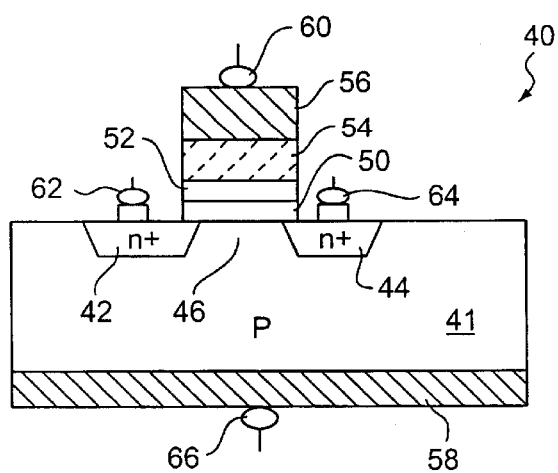
FIG. 1 shows an exemplary ferroelectric FET integrated circuit device in which an electrode according to the invention may be used.

It should be understood that FIGS. 1–5 depicting ferroelectric devices are not meant to be actual plan or cross-sectional views of any particular portion of a ferroelectric device. In the actual devices, the layers will not be as regular and the thickness and other dimensions will generally have different proportions because, if true relative thickness were shown, the drawing would not fit on a page. The various layers in actual devices often are curved and possess overlapping edges. The figures instead show idealized representations which are employed to explain more clearly and fully the method of the invention than would otherwise be possible. Also, the disclosure represents only a few examples of innumerable variations of ferroelectric devices and processes according to the invention.

FIG. 1 depicts a ferroelectric FET integrated circuit memory cell 40. Directing attention to FIG. 1, a cross-sectional view of a portion of ferroelectric FET 40 according to the invention is shown. FET 40 includes a substrate 41 which is preferably p-type silicon. Highly doped areas 42 and 44, preferably n-type, are formed in substrate 40. We shall refer to these doped areas 42 and 44 herein as source/drains since they can either be a source or a drain depending on the relative voltages applied to the areas. A channel region 46, preferably also n-type but not as highly doped as source/drains 42 and 44, is formed between source/drains 42 and 44. Insulating layers 50 and 52 are preferably formed on substrate 41 above channel region 46. A ferroelectric layer 54 is formed above channel 46, preferably on insulator 52, and a gate electrode 56 is formed on ferroelectric 54. This electrode 56 and ferroelectric layer 54 are made according to the materials and processes of the invention and will be discussed in much more detail below. As will be seen, the electrode includes a metal that is the same as one of the metal elements in the ferroelectric layer 54. In a preferred embodiment, the electrode is made of an alloy containing the metal. The alloy is preferably eutectic. That is, it is formed at the lowest possible temperature of solidification of the alloy.

A conductor 58 may be formed on the bottom of substrate 41. Wiring layers form electrical contacts 60, 62 and 64 to gate 56, source/drain 42, and source/drain 44, respectively. A contact 66 is also shown adjacent conductor 58 to illustrate that this is the contact to the substrate in this embodiment. As is known in the art, substrate 40 is written to and read by applying an electrical bias via contacts 60, 62, 64, and 66. Details of a ferroelectric memory having a memory cell including a ferroelectric FET are described in U.S. Pat. No. 5,523,964 issued Jun. 4, 1996 to McMillan et al., and U.S. Pat. No. 6,326,076 B1 issued May 22, 2001 to Arita et al., which are hereby incorporated by reference as though fully disclosed herein.

Figure 2:
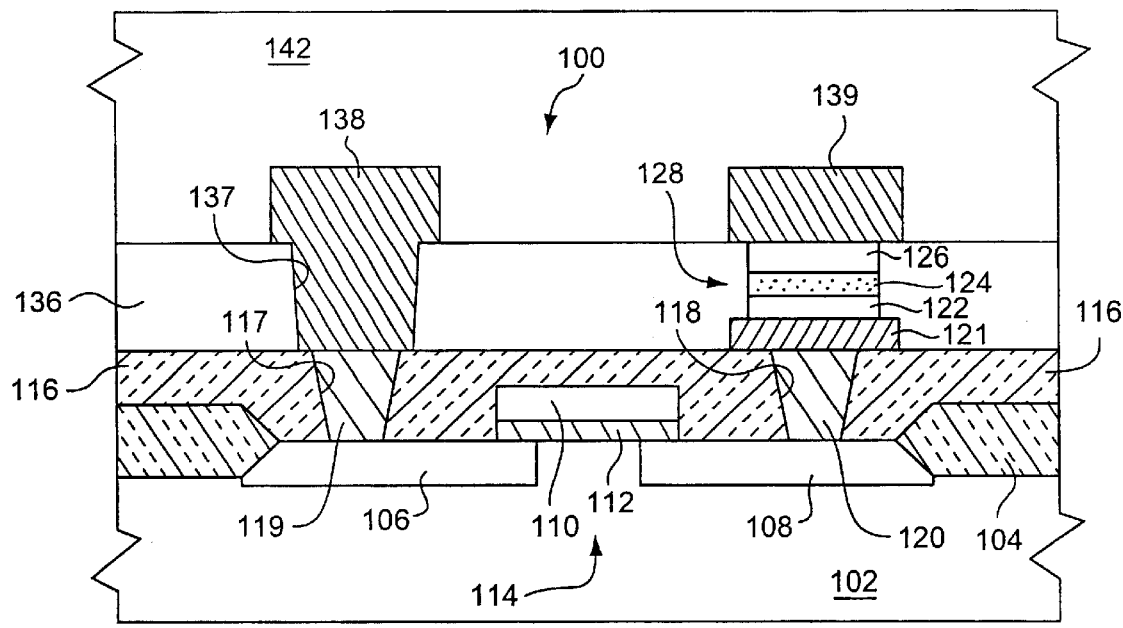
FIG. 2 shows a ferroelectric integrated circuit memory cell in which one or more electrodes according to the invention may be used.

FIG. 2 shows a cross-sectional view of an exemplary nonvolatile ferroelectric memory cell 100 containing a MOSFET 114 and a ferroelectric capacitor 128 fabricated according to the invention. The general manufacturing steps for fabricating integrated circuits containing MOSFETs and ferroelectric capacitor elements are described in U.S. Pat. No. 5,466,629 issued Nov. 14, 1995 to Mihara et al., and U.S. Pat. No. 5,468,684 issued Nov. 21, 1995 to Yoshimori et al., which are hereby incorporated by reference as if fully disclosed herein. General fabrication methods have been described in other references also. Therefore, the elements of the circuit of FIG. 2 will be simply identified here.

In FIG. 2, a field oxide region 104 is formed on a surface of a substrate 102. Wafer substrate 102 may comprise silicon, gallium arsenide or other semiconductor, or an insulator, such as silicon dioxide, glass or magnesium oxide (MgO), but is preferably silicon. A source region 106 and a drain region 108 are formed separately from each other within substrate 102. A gate insulating layer 112 is formed on substrate 102 between source and drain regions 106 and 108. A gate electrode 110 is formed on gate insulating layer 112. Source region 106, drain region 108, gate insulating layer 112 and gate electrode 110 together form a MOSFET 114. A first interlayer dielectric layer (ILD) 116 made of BPSG (borondoped phospho-silicate glass) is formed on substrate 104 and field oxide region 102. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. Diffusion barrier layer 121 is made of, for example, titanium nitride, and typically has a thickness of 10 nanometers (nm)–20 nm. Diffusion barrier layers, such as titanium nitride, inhibit the diffusion of chemical species between the underlying and overlying layers of memory 100. A bottom electrode layer 122, preferably made according to the invention, is deposited on diffusion barrier layer 121, then a ferroelectric thin film 124 is formed on bottom electrode layer 122. A top electrode layer 126, made according to the invention, is formed on ferroelectric thin film 124. Bottom electrode layer 122, ferroelectric thin film 124 and top electrode layer 126 together form ferroelectric capacitor 128. The details of the materials and fabrication process for electrodes 122 and 126 and ferroelectric thin film 124 are discussed in detail below. A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136. ILD 136 is patterned to form a via 137 to plug 119. A metallized wiring film is deposited to cover ILD 136 and fill via 137 and then patterned to form source electrode wiring 138 and top electrode wiring 139. Wirings 138, 139 preferably comprise Al-Si-Cu standard interconnect metal with a thickness of about 200 nm–300 nm.

FIGS. 1 and 2 depict only two of many variations of nonvolatile ferroelectric memory cells that can be fabricated using the method of the invention. It is contemplated that the electrodes according to the invention can be used with any ferroelectric integrated circuit device known in the art.

Ferroelectric materials include layered superlattice materials, $ABO_3$-type materials and many other materials known in the art. U.S. Pat. No. 5,519,234 issued May 21, 1996 to Araujo et al., incorporated herein by reference, discloses that layered superlattice compounds, such as strontium bismuth tantalate (SBT), have excellent properties in ferroelectric applications as compared to the best prior art materials and have high dielectric constants and low leakage currents. The layered superlattice materials may be summarized generally under the formula:

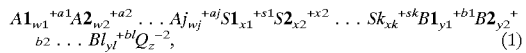

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in Formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, Formula (1) includes the cases where the unit cell may vary throughout the material; e.g., in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although Formula (1) is written in the more general form since the invention is intended to include the cases where either of the sites and the superlattice generator can have multiple elements. The value of z is found from the equation:

$$(a1w1+a2w2 \ldots +ajwj)+(s1 \times 1+s2 \times 2 \ldots +skxk)+(b1y1+b2y2 \ldots +blyl)=2z. \qquad (2)$$

Formula (1) includes all three of the Smolenskii type compounds discussed in U.S. Pat. No. 5,519,234 issued May 21, 1996 to Araujo et al. The layered superlattice materials do not include every material that can be fit into Formula (1), but only those which spontaneously form themselves into crystalline structures with distinct alternating layers.

The word "substrate" can mean underlying wafer 41, 102, 345, 501 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as 122, the substrate includes layers 121 and 116 on which electrode 122 is formed.

The term "thin film" is used herein as it is used in the integrated circuit art. Generally, it means a film of less than one micron in thickness. The thin films according to the invention disclosed herein are in all instances less than 0.5 micron in thickness. Preferably, ferroelectric thin film 124 is 40 nm to 100 nm thick and electrodes 56, 122, and 126 are preferably about 100 nm thick. These thin films of the integrated circuit art should not be confused with the "thin films" used in layered capacitors of the macroscopic capacitor art which are formed by a wholly different process that is incompatible with the integrated circuit art.

Terms of orientation, such as "top", "upper", "below", "bottom", and "lower" herein mean relative to semiconductor substrate 41, 102, 345 and 501 in FIGS. 1–5, respectively. That is, if a second element is "above" a first element, it means it is farther from the semiconductor substrate; and if it is "below" another element, then it is closer to the semiconductor substrate than the other element. The long dimension of semiconductor substrate 41, 102, 345 and 501 defines a plane that is considered to be a "horizontal" plane herein, and directions perpendicular to this plane are considered to be "vertical". The terms "over" and "directly over" are used synonymously when at least a portion of a particular layer is vertically straight above at least a portion of another layer. For example, in FIG. 2, top electrode 126 is directly over barrier layer 121. The terms "over" and "directly over" do not mean that the particular layer is in direct contact with an underlying layer. For example, layered superlattice material layer 124 typically does not contact the top surface of semiconductor substrate 102, but it is above it. The term "on" is often used in the specification when referring to the deposition or formation of an integrated circuit layer directly onto an underlying substrate or layer. In contrast to "over" and "directly over", the term "directly on" generally signifies direct contact, as is clear in the various contexts in which they are used.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

Figure 3:
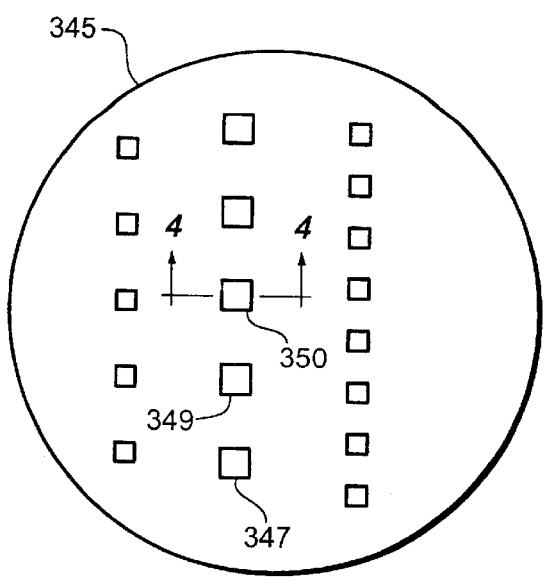
FIG. 3 is a plane view of an integrated circuit wafer on which ferroelectric capacitors having electrodes according to the invention were made.
Figure 4:
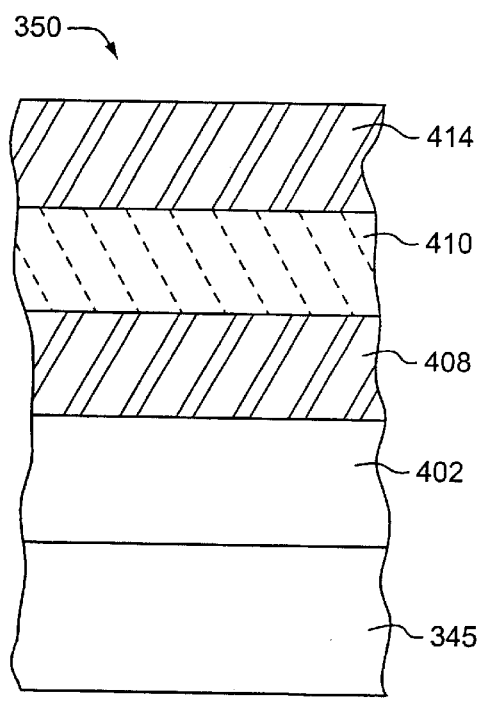
FIG. 4 is a cross-sectional view of a ferroelectric capacitor of FIG. 3 taken through the line 4—4 of FIG. 3.

FIG. 3 is a top view of an exemplary wafer on which thin film capacitors 347, 349 and 350 fabricated on substrate 345 in accordance with the invention are shown greatly enlarged. FIG. 4 is a portion of a cross-section of FIG. 3 taken through the lines 4—4, illustrating a thin film capacitor device 350 fabricated in accordance with the invention. Capacitor 350 includes a substrate 345 which is preferably a single crystal silicon wafer, but may also be gallium arsenide, germanium, silicon germanium, glass, ruby, or any other conventional substrate material. In the embodiments fabricated, a silicon dioxide layer 402 is formed on a silicon crystal substrate 345. However, as known in the art, this layer is optional, or may be replaced with other suitable material on which it is desired to form an electrode. A lower electrode 408, preferably made of a material according to the invention, is formed on silicon dioxide layer 402. Details of this lower electrode will be discussed below. Capacitor 350 also includes ferroelectric layer 410 which is preferably a layered superlattice material or an $ABO_3$-type ferroelectric, often referred to as perovskites, such as PZT, but any other ferroelectric material having desirable properties may be used. Capacitor 350 also includes an upper electrode 414, also preferably made of a material according to the invention, and is formed on ferroelectric 410. At least one of electrodes 408 and 410 are made of a material according to the invention.

Figure 5:
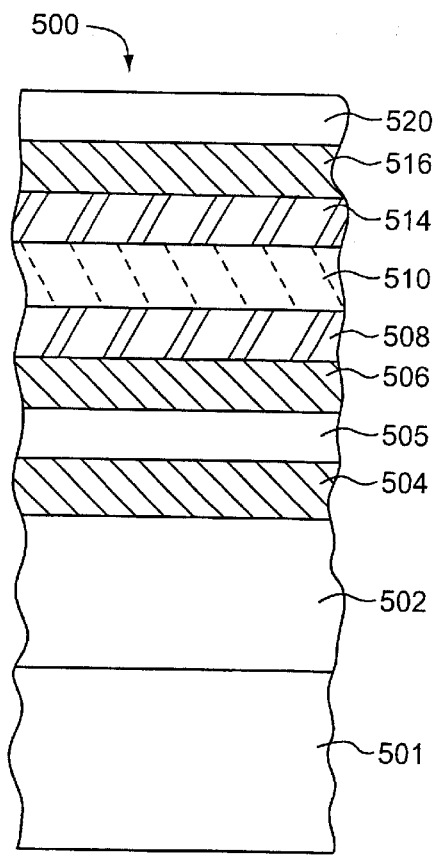
FIG. 5 is a cross-sectional view of a generalized ferroelectric capacitor utilizing the electrodes according to the invention.

As known in the art, capacitor 350 may include many other layers in addition to the layers shown. FIG. 5 shows a generalized capacitor 500 that illustrates some of these layers that are used most often. Capacitor 500 includes a substrate 501, which may be any of the substrate materials mentioned above, a silicon oxide or other suitable layer 502, an adhesion layer 504, a barrier layer 505 which prevents migration of chemical elements from the silicon layers below it to the ferroelectric and other layers above it, a first lower electrode layer 506, a second lower electrode layer 508, a ferroelectric layer 510, a first upper electrode layer 514, a second upper electrode layer 516, and a protective hydrogen barrier layer 520. Any of these layers, except one of electrode layers 508 and 514 which is made of a material according to the invention and ferroelectric layer 510, may be eliminated. The layers may also be formed in a different order. For thoroughness, in both the example of FIG. 4 and the example of FIG. 5, two electrodes are shown, but the invention contemplates that the electrodes according to the invention may be used in applications, such as the ferroelectric FET of FIG. 1, utilizing only one electrode.

Figure 6:
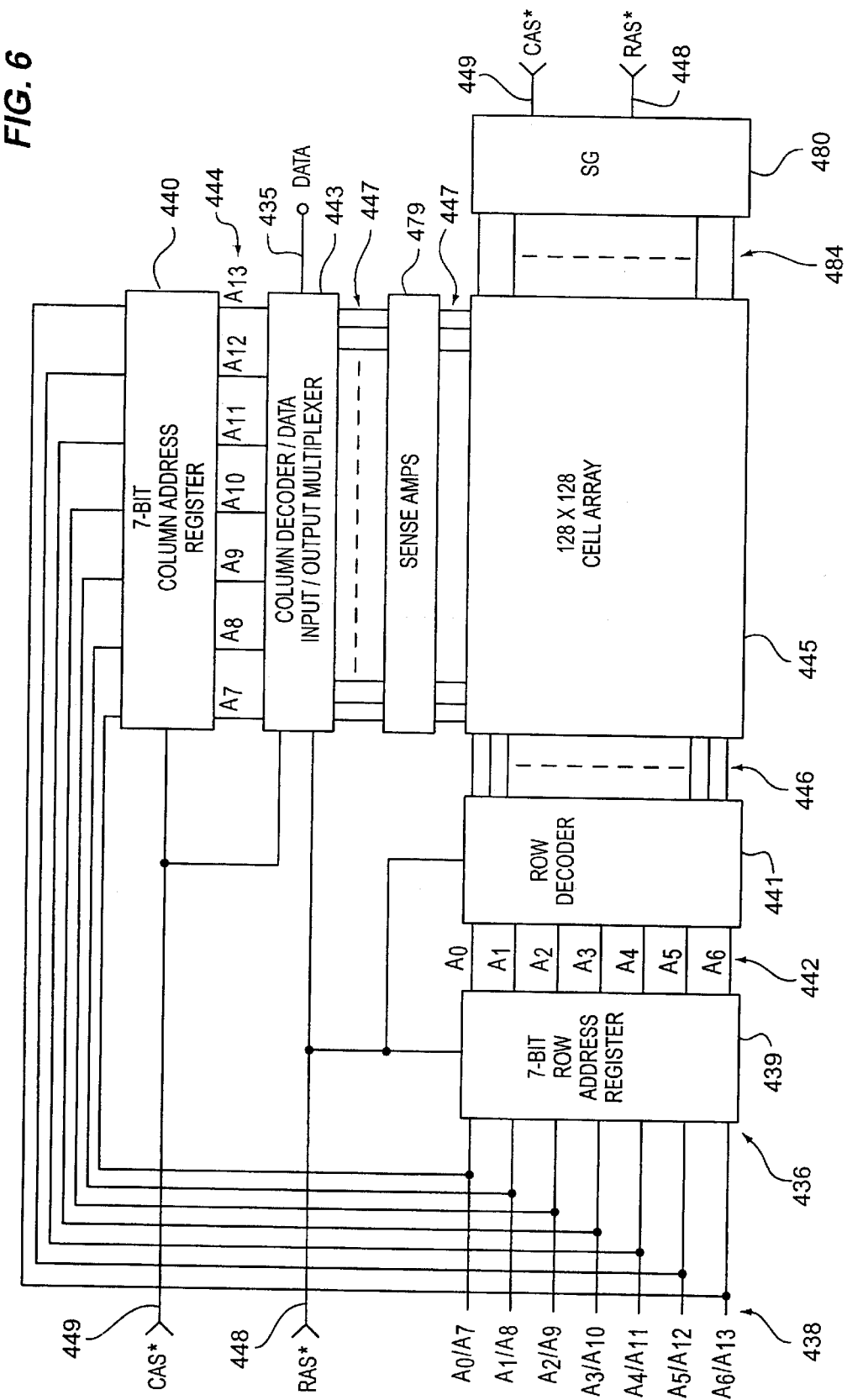
FIG. 6 is an exemplary non-volatile ferroelectric memory illustrating one of the preferred applications of the invention.

FIG. 6 is a block diagram illustrating an exemplary integrated circuit memory 436 in which memory arrays 445 of memory cells, such as 40 or 100, according to the invention are utilized. Memory 436 is presented only to place the various portions of the invention described above within the context of the memory art, and as an illustration of a possible application of the devices according to the invention as described above. Those skilled in the art will recognize that many other applications are possible. For simplicity, the embodiment shown is for a 16K×1 FeRAM; however, the material may be utilized in a wide variety of sizes and types of memories. In the 16K embodiment shown, there are seven address input lines 438 which connect to a row address register 439 and a column address register 440. Row address register 439 is connected to row decoder 441 via seven lines 442, and column address register 440 is connected to a column decoder/data input/output multiplexer 443 via seven lines 444. Row decoder 441 is connected to a 128×128 memory cell array 445 via 128 lines 446, and column decoder/data input/output multiplexer 443 is connected to sense amplifiers 479 and memory cell array 445 via 128 lines 447. A signal generator 480 is connected to array 445 via up to 256 lines 484. A RAS signal line 448 is connected to row address register 439, row decoder 441, column decoder/data input/output multiplexer 443, and signal generator 480, while a CAS signal line 449 is connected to column address register 440, column decoder/data input/ output multiplexer 443, and signal generator 480. (In the discussion herein, an indicates the inverse of a signal.) An input/output data line 435 is connected to column decoder/ data input/output multiplexer 443.

Memory cell array 445 contains 128×128=16,384 memory cells, which is conventionally designated as 16K. These cells are ferroelectric switching FETs such as 40 or capacitor-based cells such as 100. Lines 446 correspond to the word lines, such as 110. Lines 447 correspond to the gate and bit lines, such as 56 and 138.

The operation of the memory in FIG. 6 is as follows. Row address signals $A_0$ through $A_6$ and column address signals $A_7$ through $A_{13}$ placed on lines 438 are multiplexed by address registers 439, 440 utilizing the RAS* and CAS* signals, and passed to row decoder 441 and column decoder/ data input/output multiplexer 443, respectively. Row decoder 441 places the word line signals, such as the WLn signals discussed above, on the one of the word lines 446 corresponding to the cell that is addressed. Column decoder/ data input/output multiplexer 443 either places the data signal which is input on line 435 on the one of the gate lines 447 corresponding to the column address, or outputs on the data line 435 the signal on the one of the bit lines 447 corresponding to the column address, depending on whether the function is a write or read function. These are the gate line signal, PLm, and the bit line signal, BLm, discussed above. As is known in the art, the read function is triggered when the RAS* signal precedes the CAS* signal, and the write function is triggered when the CAS* signal comes before the RAS* signal. As is well-known in the art, sense amplifiers 479 are located along lines 447 to amplify the signals on the lines. The drain and substrate signals, such as DLn and SBn signals discussed above, are produced by signal generator 480 based on the CAS* and RAS* signals and an internal chip clock. In some memories, signal generator 480 and row decoder 441 may be combined into a single signal generation unit. The circuitry of row decoder 441 and signal generator 480 includes all circuitry required to produce the word line, drain line, and substrate signals discussed above. This circuitry is known in the art of integrated circuit memory design, and will not be further discussed herein. Other logic required or useful to carry out the functions outlined above, as well as other known memory functions, is also included in memory 436 but is not shown or discussed as it is not directly applicable to the invention.

Figure 7:
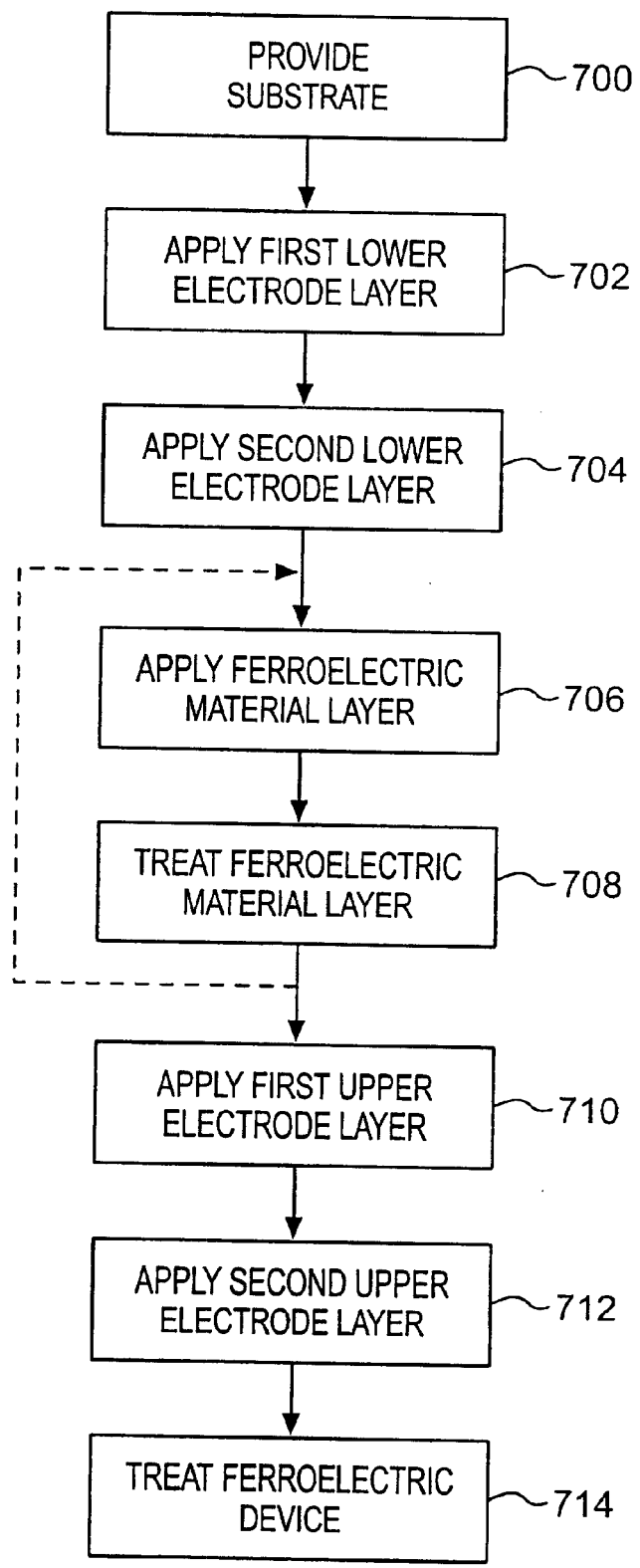
FIG. 7 is a flow diagram illustrating an exemplary process for fabricating ferroelectric devices having electrodes according to the invention.

FIG. 7. is a process flow schematic for a preferred aspect of the invention. In step 700, a substrate, such as a partially completed integrated circuit 100, is up to layer 121, or integrated circuit capacitors, such as 350 or 500, is up to layers 402 or 506, respectively. In this discussion, we will assume that substrate 350 up through silicon dioxide layer 402 is provided. The electrode material is applied, prepared as part of act 702, preferably by sputtering, but chemical vapor deposition, spin-on, or misted deposition may be used, depending on the electrode material. If the lower electrode is a multi-layer electrode, another electrode layer is applied in act 704; otherwise, this act is skipped. Additional layers may also be applied if the embodiment requires three or more electrode layers, though usually only one or two electrode layers are used. In step 706, a ferroelectric material layer is applied to the substrate. The ferroelectric thin film is preferably applied using a liquid deposition technique, such as spin-coating, a misted deposition method as described in U.S. Pat. No. 5,997,642 issued Dec. 7, 1999 to McMillan et al., or chemical vapor deposition as described in U.S. Pat. No. 6,110,531 issued Aug. 29, 2000 to McMillan et al., both of which are hereby incorporated by reference. At 708, ferroelectric layer 410 is treated. Preferably, the treating can include drying the ferroelectric material coating by baking on a hot plate in $O_2$ gas for one minute at 160° C., followed by four minutes at 260° C. Preferably, acts 706 and 708 are repeated until the desired thickness of ferroelectric material is obtained. Preferably, treating 708 further includes crystallizing the ferroelectric material using rapid-thermal-processing (RTP), preferably at 675° C. for 30 seconds in $O_2$ gas, with a ramping rate of 100° C. per second. Preferably, act 708 further includes a first anneal, preferably for 60 minutes at 800° C.

At 710 and 712, an upper electrode is deposited onto the ferroelectric material. The electrode material is applied preferably by sputtering, but chemical vapor deposition, spin-on, or misted deposition may be used, depending on the electrode material. If the lower electrode is a multi-layer electrode, another electrode layer is applied in act 712; otherwise, this act is skipped. Additional layers may also be applied if the embodiment requires three or more electrode layers. At 712, the ferroelectric device is treated. Preferably, the treatment step comprises a furnace anneal in oxygen, preferably at 675° C. for from 15 minutes to one hour, most preferably for 30 minutes.

The processes of making integrated circuit devices utilizing ferroelectric materials are well-known, as disclosed in the patents incorporated by reference herein. It is contemplated that the electrode materials, structures, and processes of the invention can be used with most of these known processes. These processes are continuously being improved, and it is contemplated that the electrode materials, structures, and processes of the invention will be able to be used with many ferroelectric integrated circuit device structures and processes to be developed, since ferroelectric integrated circuit devices inherently utilize at least one electrode.

EXAMPLE 1

A silicon dioxide layer 402 is grown by conventional process on a silicon wafer 345. A 65/35 eutectic platinum/bismuth alloy 408 was sputtered onto the silicon dioxide to form a bottom or lower electrode 408. A strontium bismuth tantalate precursor solution commercially available from Kojundo Corporation in Japan and available in the United States containing relative molar proportions of the elements strontium, bismuth, tantalum and niobium corresponding approximately to the formula $Sr_{0.9}Bi_{2.2}Ta_2O_9$, in which the mole ratio of strontium to bismuth, Sr/Bi, is about 0.4, was spun onto the electrode to form a liquid coating and dried and annealed as discussed above to form ferroelectric layer 410. A top or upper electrode was formed in an identical manner as the lower electrode, and then capacitor 350 is annealed as discussed above.

EXAMPLE 2

A capacitor 350 identical to the capacitor of Example 1 was made, except that the ferroelectric was strontium bismuth tantalum niobate made with a liquid precursor available from Kojundo Corporation.

EXAMPLE 3

A capacitor 350 similar to the capacitor of Example 1 was made, except that the electrodes are made from a 70/30 platinum/titanium alloy and the ferroelectric was bismuth titanate (BTO) made with a liquid precursor available from Kojundo Corporation.

EXAMPLE 4

A capacitor similar to the capacitor of Example 3 was made, except that the ferroelectric is bismuth lanthanum titantate (BLT) made from commercially available precursors available from Alpha Aesar, 30 Bond Street, Ward Hill, Mass. 01835 USA; Telephone: 1-978-521-6300; Fax: 1-978-521-6350; e-mail: info@alfa.com; and website: www.alfa-.com. In all examples, the lanthanide and titanium precursors were isopropoxides, the bismuth precursor was triphenyl bismuth, and the solvent was octane. The ferroelectric deposition process was OCVD at 650° C. followed by RTP at 675° C. and a furnace anneal in oxygen at 50° C.

EXAMPLE 5

A capacitor similar to the capacitor of Example 1 was made, except that the bottom electrode was bismuth oxide/platinum/titanium and the top electrode was platinum/bismuth oxide, with the bismuth oxide adjacent the strontium bismuth titanate for both electrodes. The bismuth oxide, the platinum and the titanium were applied by sputtering.

EXAMPLE 6

A capacitor similar to the capacitor of Example 5 was made, except that the bismuth oxide was applied by MOCVD.

EXAMPLE 7

A capacitor similar to the capacitor of Example 1 was made, except that the bottom electrode was tantalum oxide/platinum/titanium and the top electrode was platinum/tantalum oxide, with the tantalum oxide adjacent the strontium bismuth tantalate for both electrodes. The tantalum oxide, the platinum and the titanium were applied by sputtering.

EXAMPLE 8

A capacitor similar to the capacitor of Example 6 was made, except that the bismuth oxide was applied by low temperature MOCVD, with the substrate at about 450° C., without annealing, so the bismuth oxide did not crystallize and was amorphous.

EXAMPLE 9

A capacitor 350 similar to the capacitor of Example 3 was made, except that the lower electrode was made from sputtered titanium.

EXAMPLE 10

A capacitor 350 similar to the capacitor of Example 4 was made, except that the lower electrode was made from sputtered titanium.

EXAMPLE 11

A capacitor 350 similar to the capacitor of Example 3 was made, except that the ferroelectric material was PZT.

EXAMPLE 12

A capacitor similar to the capacitor of Example 1 was made, except that the electrode material adjacent the ferroelectric was strontium ruthenium oxide ($SrRuO_3$). That is, the bottom electrode was $SrRuO_3$/platinum/titanium and the top electrode was platinum/bismuth oxide, with the bismuth oxide adjacent the strontium bismuth titanate for both electrodes. The strontium ruthenium oxide, the platinum, and the titanium were applied by sputtering.

EXAMPLE 13

A capacitor 350 similar to the capacitor of Example 12 was made, except that the electrode material adjacent the ferroelectric was lanthanum strontium cobalt.

EXAMPLE 14

A capacitor 350 similar to the capacitor of Example 13 was made, except that the ferroelectric was bismuth lanthanum titantate (BLT).

Figure 8:
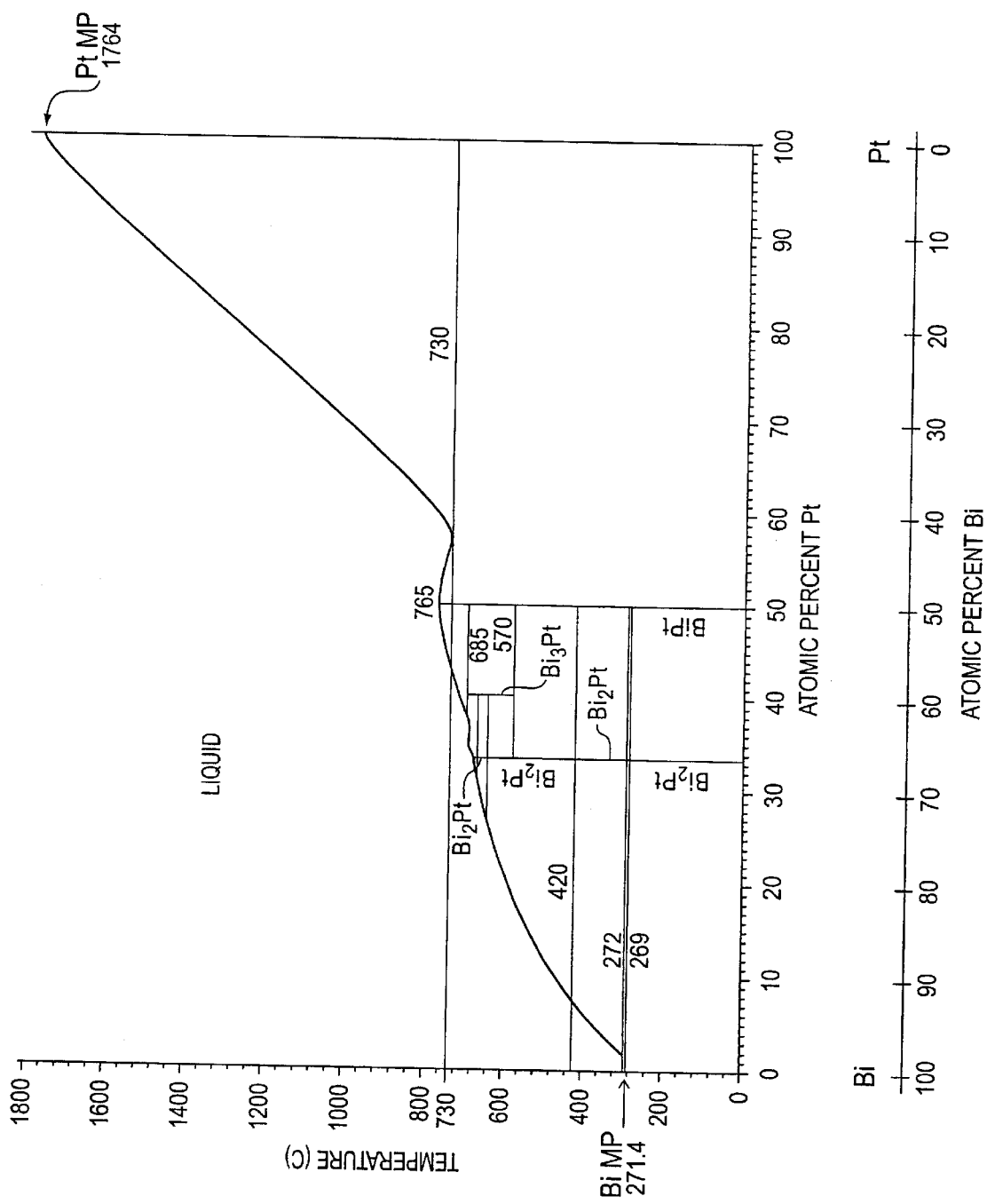
FIG. 8 is a phase diagram of alloyed bismuth and platinum for illustrating certain features of the invention.

All of the above produced ferroelectric capacitors in which the ferroelectric could be switched and a hysteresis curve measured. The example in which the electrode metal alloy is platinum bismuth used with a bismuth layered superlattice material showed the most promise. The use of the bismuth platinum alloy reduces bismuth diffusion from the bismuth layered material. This reduces the degradation of the ferroelectric properties caused by lack of Bi at the ferroelectric/electrode interface. Preferably, the concentration of platinum in the metal alloy is greater than 50% atomic weight. Preferably, the metal alloy is eutectic. FIG. 8 is a phase diagram showing the various phases of the bismuth/platinum alloy as a function of atomic percent of platinum and bismuth and as a function of temperature. As can be seen from FIG. 8, in the region where the concentration of platinum is greater than 50%, the melting point is 730° C. or higher. This ensures that the electrode will not melt at ferroelectric integrated circuit processing temperatures. More preferably, the concentration of platinum in the metal alloy electrode is greater than 60% atomic weight. This ensures that the electrodes will be stable at 730° C. and higher.

There has been described novel electrode materials, processes, and structures for use in ferroelectric integrated circuits. It is evident that those skilled in the art may now make numerous uses and modifications of the specific embodiments described, without departing from the inventive concepts. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the ferroelectric integrated circuits and processes for making such integrated circuits which have been described.

What is claimed is:

1. A ferroelectric integrated circuit, comprising:
   a thin film of ferroelectric layered superlattice material including a superlattice generator metal; and
   a non-oxide electrode layer in contact with said thin film of layered superlattice material, said non-oxide electrode layer comprising said superlattice generator metal at a concentration greater than 10 atomic percent.

2. A ferroelectric integrated circuit as in claim 1 wherein said non-oxide electrode layer is included in a multi-layer electrode.

3. A ferroelectric integrated circuit as in claim 1 wherein said non-oxide electrode layer comprises a metal alloy containing said superlattice generator metal.

4. A ferroelectric integrated circuit as in claim 3 wherein said superlattice generator metal comprises bismuth and said alloy is a platinum bismuth alloy.

5. A ferroelectric integrated circuit as in claim 4 wherein a bismuth concentration is 50% or less.

6. A ferroelectric integrated circuit as in claim 4 wherein a platinum concentration in said alloy is 60% or greater.

7. A ferroelectric integrated circuit as in claim 4 wherein said alloy is eutectic.

8. A ferroelectric integrated circuit as in claim 3 wherein said alloy is eutectic.

9. A ferroelectric integrated circuit as in claim 1 wherein said superlattice generator metal comprises bismuth.

10. A ferroelectric integrated circuit as in claim 1 wherein said ferroelectric material comprises either strontium bismuth tantalate or strontium bismuth tantalum niobate.

11. A ferroelectric integrated circuit as in claim 1 wherein said non-oxide electrode layer comprises a crystalline compound containing said superlattice generator metal.

12. A ferroelectric integrated circuit as in claim 1 wherein said non-oxide electrode layer comprises an amorphous material containing said superlattice generator metal.

13. A ferroelectric integrated circuit as in claim 1 further comprising a second non-oxide electrode layer in contact with said thin film of ferroelectric material, said second non-oxide electrode layer comprising said superlattice generator metal at a concentration greater than 10 atomic percent.

* * * * *